United States Patent
Rameau

(10) Patent No.: US 10,521,516 B2
(45) Date of Patent: Dec. 31, 2019

(54) CRITERION FOR SEQUENTIAL UPDATE

(71) Applicant: DASSAULT SYSTEMES, Velizy Villacoublay (FR)

(72) Inventor: Jean-Francois Rameau, Lisses (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 587 days.

(21) Appl. No.: 14/835,304

(22) Filed: Aug. 25, 2015

(65) Prior Publication Data

US 2016/0063141 A1   Mar. 3, 2016

(30) Foreign Application Priority Data

Aug. 26, 2014   (EP) .................................... 14306316

(51) Int. Cl.
   *G06F 17/50* (2006.01)

(52) U.S. Cl.
   CPC .................................... *G06F 17/50* (2013.01)

(58) Field of Classification Search
   CPC .... G06F 17/5086; G06F 17/50; G06T 11/206; G06T 17/10
   See application file for complete search history.

(56) References Cited

U.S. PATENT DOCUMENTS 5,165,015 A * 11/1992 Coggins ................... G06F 17/50
                                                       703/1
5,251,290 A * 10/1993 Pabon ................. G06F 17/5086
                                                       345/420

(Continued)

FOREIGN PATENT DOCUMENTS

| EP | 2 354 986 A1 | 8/2011 |
| EP | 2 474 928 A1 | 7/2012 |
| EP | 2 474 929 A1 | 7/2012 |
| JP | Hei 04-311272 | 11/1992 |
| JP | 2008-165809 | 7/2008 |

(Continued)

OTHER PUBLICATIONS

Krishna, K., K. Ganeshan, and D. Janaki Ram. "Distributed simulated annealing algorithms for job shop scheduling." IEEE Transactions on Systems, Man, and Cybernetics 25.7 (1995): 1102-1109. (Year: 1995).*

(Continued)

*Primary Examiner* — Omar F Fernandez Rivas
*Assistant Examiner* — Joshua E. Jensen
(74) *Attorney, Agent, or Firm* — Oblon, McClelland, Maier & Neustadt, L.L.P.

(57) ABSTRACT

A method for designing a 3D modeled object can implement a modeling graph having nodes that represent geometrical objects and arcs that each represent a relationship, wherein procedural relationships are represented by unidirectional arcs, wherein the relationships linking the geometrical objects further include live relationships that are represented by bidirectional arcs, and wherein the provided modeling graph respects a criterion that all the arcs of each strong component of the modeling graph are bidirectional. Upon adding a relationship linking two of the geometrical objects that are included in the data defining the 3D modeled object before the addition, the method selects two geometrical objects to be linked by the relationship to be added, the selection being performed according to the criterion.

11 Claims, 12 Drawing Sheets

(56) References Cited

U.S. PATENT DOCUMENTS

| | | | | |
|---|---|---|---|---|
| 2008/0172208 | A1* | 7/2008 | Lechine | G06F 17/50 703/1 |
| 2010/0274818 | A1* | 10/2010 | Chauvin | G06F 17/30958 707/803 |
| 2011/0098837 | A1* | 4/2011 | Yucel | G06F 17/5086 700/104 |
| 2011/0112803 | A1* | 5/2011 | Diguet | G06F 17/50 703/1 |
| 2012/0109589 | A1* | 5/2012 | Thompson | G06F 17/5086 703/1 |
| 2012/0316841 | A1* | 12/2012 | Rameau | G06F 17/50 703/1 |

FOREIGN PATENT DOCUMENTS

| | | |
|---|---|---|
| JP | 2011-100455 | 5/2011 |
| JP | 2012-528384 | 11/2012 |

OTHER PUBLICATIONS

U.S. Appl. No. 14/835,354, filed Aug. 25, 2015, Rameau.

European Search Report dated Feb. 18, 2015, in European Patent Application No. 14306317.0.

European Search Report dated Feb. 17, 2015, in European Patent Application No. 14306316.2.

Yin Z, et al: "Virtual Prototyping of Mold 1-15 Design: Geometric Mouldability Analysis for Near-net-shape Manufactured Parts by Feature Recognition and Geometric Reasoning", Computer Aided Design, Elselvier Publishers BV., Barking, GB, vol. 33, No. 2, Feb. 1, 2001 (Feb. 1, 2001), pp. 137-154, XP004227233, ISSN: 0010-4485, DOI: 10.1016/S0010-4485 (00) 00084-1.

Li, Y-T, et al: "A Constructive Approach to 9-15 Solving 3-0 Geometric Constraint Systems Using Dependence Analysis", Computer Aided Design, Elsevier Publishers BV., Barking, GB, vol. 34,.No. 2, Feb. 1, 2002 (Feb. 1, 2002), pp. 97-108, XP004322743, ISSN: 0010-4485, DOI: 10.1016/S0010-4485 (01) 00054-9.

Strongly Connected Component. (n.d.). In Wikipedia. Retrieved Aug. 25, 2015, from https://en/wikipedia.org/wiki/Strongly_connected_component.

"Handbook of Solid Modeling"; Donald E. Lacourse, Ed.: Mac Graw Hill. Abstract. Retrieved Aug. 25, 2015, from http://www.amazon.com/Handbook-Solid-Modeling-Donald-Lacourse/dp/0070357889.

Frank Harary, Graph Theory, Addison Wesley 1969. Abstract. Retrieved Aug. 25, 2015, from http://www.amazon.com/Theory-Demand-Printing-Advanced-Program/dp/0201410338.

English Translation of Japanese Office Action dated Aug. 20, 2019 in Japanese Patent Application No. 2015-165984.

* cited by examiner

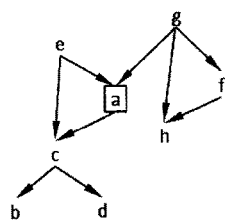
FIG. 14
$z = f(x,y)$ ⇒
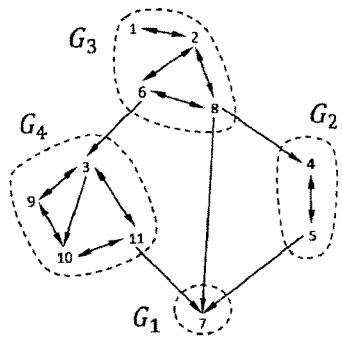
FIG. 15
FIG. 16
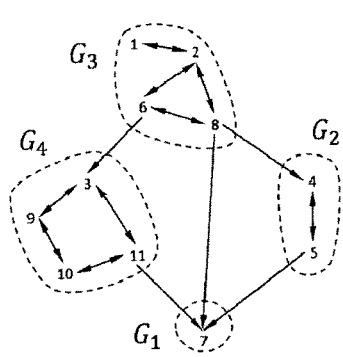
FIG. 17
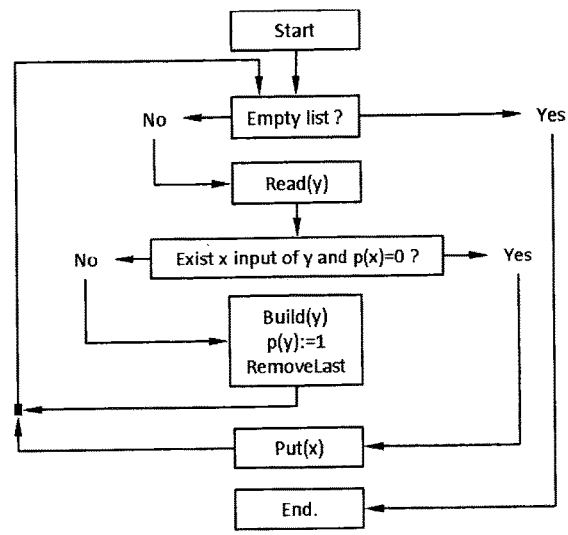
FIG. 18

CRITERION FOR SEQUENTIAL UPDATE

CROSS-REFERENCE TO RELATED APPLICATIONS

This application claims priority under 35 U.S.C. § 119 or 365 to European Application No. 14306316.2, filed Aug. 26, 2014. The entire teachings of the above application(s) are incorporated herein by reference.

FIELD OF THE INVENTION

The invention notably relates to the field of industrial design, such as vehicle design, packaging design, mechanical design, consumer goods and electronics design.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise.

The PLM solutions provided by DASSAULT SYSTEMES (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Different frameworks are provided to industrial designers for the design of a three-dimensional modeled object. In the most widely spread framework, industrial designers perform their designs via procedural relationships. More precisely, industrial designers define basic geometries and a history of procedures that transform the basic geometries into more elaborate objects that are hierarchically connected according to the history of procedures, so as to form the indented complex model. This framework is the most preferred framework, notably because it allows skilled designers to perform their design relatively fast. Indeed, using adequate procedures, one can achieve a complex model in relatively few operations. A reference on this topic is "Handbook of solid modeling"; Donald E Lacourse, Ed.: Mac Graw Hill.

In another framework, industrial designers perform their design via non-procedural relationships. More precisely, industrial designers define basic geometries and, afterwards, live relationships between the geometries, so that the set of basic geometries respecting the set of constraints forms the intended complex model.

Within this context, there is still a need for an improved solution to design a 3D modeled object.

SUMMARY OF THE INVENTION

It is therefore provided a computer-implemented method for designing a three-dimensional modeled object that represents an industrial product, and that is defined by data including a plurality of geometrical objects and relationships linking the geometrical objects, wherein the relationships linking the geometrical objects include procedural relationships. The method comprises the step of providing a modeling graph having nodes that represent the geometrical objects and arcs that each represent the relationship linking the two geometrical objects represented by the incident nodes of the arc, wherein the procedural relationships are represented by unidirectional arcs having the same orientation as the procedural relationships, wherein the relationships linking the geometrical objects further include live relationships that are represented by bidirectional arcs, and wherein the provided modeling graph respects a criterion that all the arcs of each strong component of the modeling graph are bidirectional. And the method comprises the step of, upon adding a relationship linking two of the geometrical objects that are included in the data defining the 3D modeled object before the addition, selecting two geometrical objects to be linked by the relationship to be added, the selection being performed according to the criterion.

The method may comprise one or more of the following:
- the selection of the two geometrical objects to be linked by the relationship to be added comprises selecting a first geometrical object among all geometrical objects, identifying within the modeling graph all geometrical objects for which adding the relationship between them and the first geometrical object would break the criterion, and then selecting a second geometrical object according to the identified geometrical objects;
- the relationship to be added is a live relationship and the identifying consists in determining all tribe nodes of all nodes included in the strong component of the first geometrical object, or the relationship to be added is a procedural relationship taking the first geometrical object as input and the identifying consists in determining all parent nodes of all nodes included in the strong component of the first geometrical object, or the relationship to be added is a procedural relationship having the first geometrical object as output and the identifying consists in determining all child nodes of all nodes included in the strong component of the first geometrical object;
- determining all tribe nodes or all parent nodes or all child nodes of all nodes included in the strong component of the first geometrical object is performed by determining the strong graph of the modeling graph, wherein the strong graph is the graph of strong components of the modeling graph, and then determining within the strong graph all tribe nodes or all parent nodes or all child nodes of the strong component of the first geometrical object;
- the selection of the first geometrical object and/or the second geometrical object is performed via user-interaction;

the selection of the second object is restricted to geometrical objects of the modeling graph not identified to break the criterion;
the live relationship is a styling relationship and/or a mechanical relationship;
the industrial product is a mechanical part or a consumer good; and/or
the method comprises, upon a further modification of the data defining the 3D modeled object, determining a strong graph, wherein the strong graph is the graph of strong components of the modeling graph, and updating the 3D modeled object according to a traversal of the strong graph.

It is further provided a computer program comprising instructions for performing the method.

It is further provided a computer readable storage medium having recorded thereon the computer program.

It is further provided a CAD system comprising a processor coupled to a memory and a graphical user interface, the memory having recorded thereon the computer program.

It is further provided a three-dimensional object designed by the method.

It is further provided a data file storing the three-dimensional object.

It is further provided a data structure storing the three-dimensional object.

It is further provided an industrial product represented by the three-dimensional object.

It is further provided a method for manufacturing an industrial product, comprising the steps of designing a three-dimensional object that represents the industrial product according to the above design method, and then manufacturing the industrial product based on the designed three-dimensional object.

BRIEF DESCRIPTION OF THE DRAWINGS

Embodiments of the invention will now be described, by way of non-limiting example, and in reference to the accompanying drawings, where:

FIGS. 4-32 illustrate the method.

DETAILED DESCRIPTION OF THE INVENTION

Figure 1:
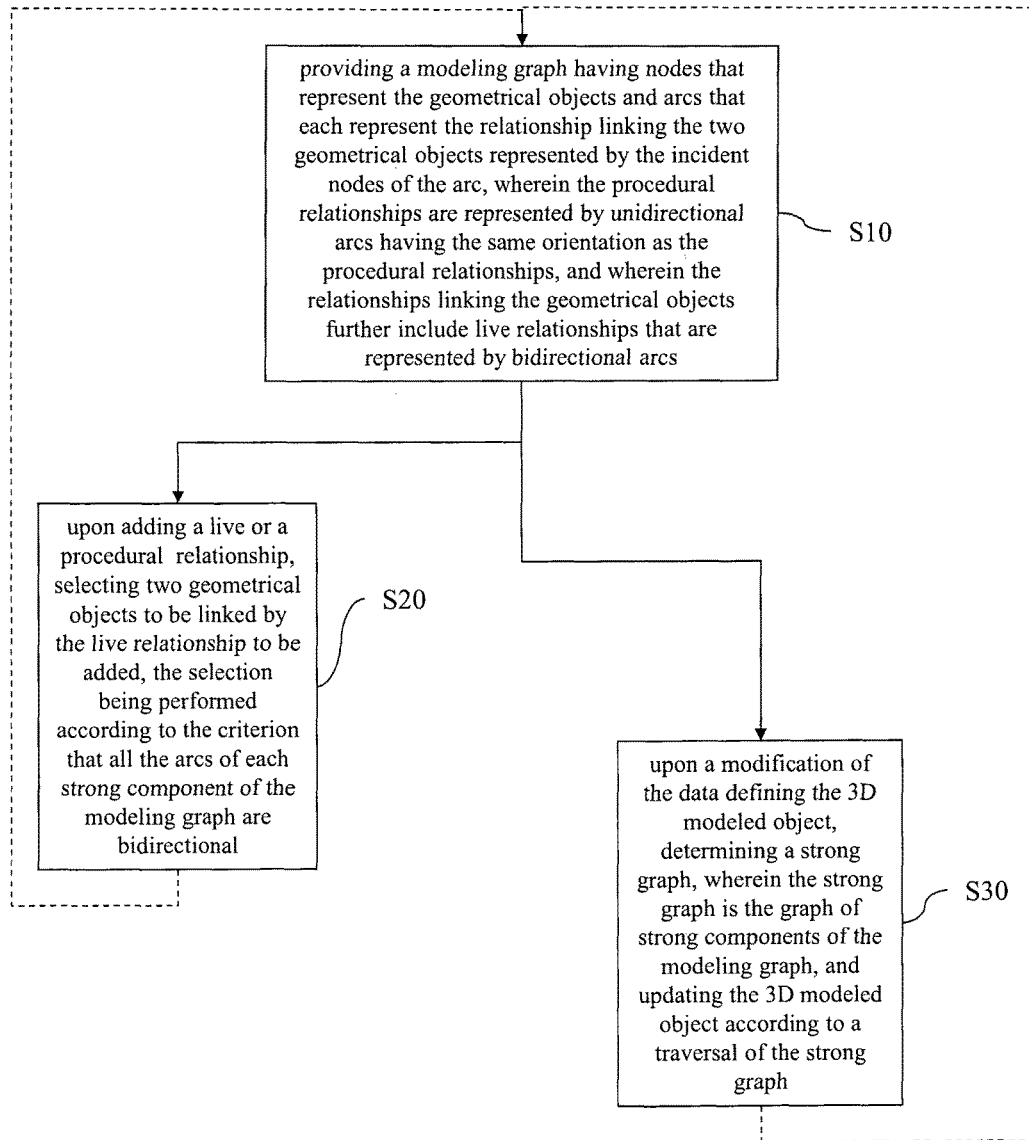
FIG. 1 shows a flowchart of an example of the method.

With reference to the flowchart of FIG. 1, it is proposed a computer-implemented method for designing a three-dimensional modeled object. The 3D modeled object represents an industrial product. The 3D modeled object is defined by data including a plurality of geometrical objects and relationships linking the geometrical objects. The relationships linking the geometrical objects include procedural relationships and live relationships. The method comprises a step of providing S10 a modeling graph having nodes that represent the geometrical objects and arcs that each represent the relationship linking the two geometrical objects represented by the incident nodes of the arc. In this graph, the procedural relationships are represented by unidirectional arcs having the same, orientation as the procedural relationships, and the live relationships are represented by bidirectional arcs. The providing step S10 is represented distinctly from other steps of the method, but the providing may actually occur, from a computer-implementation point of view, as a background process, such that the modeling graph (potentially modified throughout the method) is always provided.

As represented on FIG. 1, the method may comprise a step of determining S30, upon a modification S30 of the data defining the 3D modeled object, a strong graph. The determining may be performed e.g. from scratch or from updating/retrieving a strong graph determined at a previous iteration of the method. The strong graph is the graph of strong components of the modeling graph. The method also comprises at S30 updating the 3D modeled object according to a traversal of the strong graph. The modification S30, the determining S30 and the updating S30 are represented within the same block S30 as they may be seen as imbricated into a single step, and not necessarily sequential.

As also represented on FIG. 1, the step of providing S10 may alternatively be followed by a step of selecting S20, upon adding S20 a (live or procedural) relationship linking two (i.e. at least two) of the geometrical objects that are included in the data defining the 3D modeled object before the addition (i.e. the objects that are to be linked by the relationship being added already exist/are already instantiated, i.e. they are not newly created by the addition), two geometrical objects to be linked by the relationship to be added. Again, the selecting S20 and the adding S20 are represented within the same block as they may be seen as imbricated into a single step, and not necessarily sequential. In that case the selection S20 is performed according to a specific criterion respected by the graph, e.g. throughout the whole method. This criterion may be referred to as the "criterion of S20" or "criterion related to S20" or "sequential criterion" in the following. Specifically, the provided modeling graph respects the criterion that all the arcs of each strong component of the modeling graph are bidirectional.

As also represented on FIG. 1, steps S20 and S30 may each be followed by a reiteration. Notably, the adding of a live or procedural relationship at S20 constitutes a modification of the data defining the 3D modeled object, such that an iteration of S10 and S20 may be followed by an iteration of S10 and S30, wherein the data modification of S30 of that iteration is the adding of a live or procedural relationship of S20 of that iteration. This conceptually corresponds to an iteration of S20 and then S30, as S10 is a background process. In this case, S20 specifies S30, in the sense that it adds the further condition that the modification of the data defining the 3D modeled object is not performed in any way, but in the specific way recited in S20. For example, the method may comprise a first iteration with S10 and S20, then a second iteration with S10 and S30, and then optionally other iterations, with each time S20 or S30 being executed. Other types (not represented) of modification of the data defining the 3D modeled object, such as adding a procedural relationship that takes as input an existing geometrical object and creates as output a new geometrical object (i.e. possibly referred to as adding a "new procedure" in the following), deleting a procedural relationship, or deleting a live relationship may be contemplated. In that case, referring to the flowchart of FIG. 1, the method does not perform S20 upon said other types of modification. This iterative process corresponds to an industrial designer performing the design method in a continuous manner. Indeed, the designer adds or deletes procedural or live relationships, or he/she makes other modifications of the data defining the 3D modeled object. Each time there is such a modification, S30 may be performed. Each time the modification comprises adding a live or procedural relationship in specific, S20 may be performed, and possibly S30 may be then performed.

It is noted that S30 corresponds to an update of the 3D modeled object upon prior modifications. Such an update allows an immediate integration of the modifications, e.g. to provide a visual feedback thereof to the designer (if for example the 3D modeled object is displayed while the modifications are performed). However, such an update is not necessarily performed on the fly. It is indeed also frequent that designers perform design modifications without any update (and therefore necessarily without any visual feedback). The modifications may accumulate, and the update may occur afterwards, at any time. In such a case, the method comprises several iterations of S10 and S20 (or other modifications than those contemplated by S20). And then, the method may comprise an iteration of S10 and S30 to perform the update, possibly at another workstation, another day and/or by another person.

Such a method improves the design of a 3D modeled object. Notably, the method allows designing a three-dimensional object with both procedural relationships and live relationships. This offers to the industrial designer the architectural advantages of procedural relationships, such that the designer may use procedures in order to quickly achieve complex geometries, while offering to the industrial designer the flexibility of live relationships, such that the designer may set any constraints at any time. The method achieves the integration of these two frameworks in a robust way, by offering a systematic way of performing updates of the 3D modeled object upon modifications of its defining data. Indeed, the method may systematically perform updates according to a traversal of the strong graph at S30. By relying as it does on graph theory, the method is performed relatively fast. Indeed, representing the 3D modeled object and the relationships by a graph and performing updates of the 3D modeled object upon modifications of its defining data via the use of the strong graph allow an easy and fast update, notably because the strong graph may be easily updated from one iteration of the method to the other. For example, sub-results of the previous iterations may be used at any iteration. Thus, when iterated the method allows a smooth design. Also importantly, the method allows an intuitive and predictable update for the industrial designer. Indeed, industrial designers have widely spread and consistent design preferences. Notably, as confirmed by tests conducted by the Inventors, industrial designers expect that, when modifying the data defining a 3D modeled object including procedural relationships, the inputs of said procedural relationships are not modified/moved by the update unless modified by the designer. The method ensures this requirement by the traversal of the strong graph. Finally, in its implementation where it respects the criterion that all the arcs of each strong component of the modeling graph are bidirectional, which is ensured by the option of systematically performing S20 every time a live or procedural relationship is added to the 3D modeled object between two existing objects, the method allows the reuse of existing dedicated solvers to robustly and quickly perform the update (afterwards, that is, at S30). Indeed, the strong components offer a separation of groups of geometrical objects related by live relationships (most likely of the same kind for each group in the context of industrial design), such that the update may be performed by alternating existing and adequate live solvers and procedure executions/evaluations, as will be mentioned later when detailing examples of S30.

This is easier and more systematic than developing dedicated solvers that can handle both kinds of relationships.

The method is computer-implemented. This means that the steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement the user's wishes. In examples, this level may be user-defined and/or pre-defined.

A typical example of computer-implementation of the method is to perform the method with a system adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (eg. one for the program, and possibly one for the database).

The method generally manipulates modeled objects. A modeled object is any object defined by data stored in the database. By extension, the expression "modeled object" designates the data itself. The 3D modeled objects designed by the method have the structural specificity of having, among their defining data, the modeling graph, with arcs representing both kinds of relationships. In the implementation where the criterion of S20 is respected, the 3D modeled objects have the further specificity that the graph respects the criterion. The 3D modeled objects may be stored in a dedicated data structure, possibly in a data file.

According to the type of the system, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system, as will be apparent from the definitions of such systems provided below.

By CAD system, it is meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g. representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

The 3D modeled object may represent the geometry of a product to be manufactured in the real world subsequent to the completion of its virtual design with for instance a CAD software solution or CAD system, such as a (e.g. mechanical) part or assembly of parts, or more generally any rigid body assembly (e.g. a mobile mechanism). A CAD software solution allows the design of products in various and unlimited industrial fields, including: aerospace, architecture, construction, consumer goods, high-tech devices, industrial equipment, transportation, marine, and/or offshore or transportation. The 3D modeled object designed by the method thus represents an industrial product which may be a part of a terrestrial vehicle (including e.g. car and light truck equipment, racing cars, motorcycles, truck and motor equipment, trucks and buses, trains), a part of an air vehicle (including e.g. airframe equipment, aerospace equipment, propulsion equipment, defense products, airline equipment, space equipment), a part of a naval vehicle (including e.g. navy equipment, commercial ships, offshore equipment, yachts and workboats, marine equipment), a mechanical part (including e.g. industrial manufacturing machinery, heavy mobile machinery or equipment, installed equipment, industrial equipment product, fabricated metal product, tire manufacturing product), an electro-mechanical or electronic part (including e.g. consumer electronics, security and/or control and/or instrumentation products, computing and communication equipment, semiconductors, medical devices and equipment), a consumer good (including e.g. furniture, home and garden products, leisure goods, fashion products, hard goods retailers' products, soft goods retailers' products), a packaging (including e.g. food and beverage and tobacco, beauty and personal care, household product packaging). The method applies specifically efficiently when the 3D modeled object represents a mechanical part or a consumer good. Indeed, in those fields where the design requires relatively, industrial designers benefit relatively highly from the flexibility offered by live relationships, such that the mix of procedural relationships and live relationships offered by the method is particularly relevant.

By PLM system, it is meant any system adapted for the management of a modeled object representing a physical manufactured product. In a PLM system, a modeled object is thus defined by data suitable for the manufacturing of a physical object. These may typically be dimension values and/or tolerance values. For a correct manufacturing of an object, it is indeed better to have such values.

CAM stands for Computer-Aided Manufacturing. By CAM solution, it is meant any solution, software or hardware, adapted for managing the manufacturing data associated with a product. The manufacturing data generally includes data related to the product to manufacture, the manufacturing process and the required resources. A CAM solution is used to plan and optimize the whole manufacturing process of a product. For instance, it can provide the CAM users with information on the feasibility, the duration of a manufacturing process or the number of resources, such as specific robots, that may be used at a specific step of the manufacturing process; and thus allowing decision on management or required investment. CAM is a subsequent process after a CAD process and potential CAE process. Such CAM solutions are provided by Dassault Systemes under the trademark DELMIA®.

CAE stands for Computer-Aided Engineering. By CAE solution, it is meant any solution, software of hardware, adapted for the analysis of the physical behavior of a modeled object. A well-known and widely used CAE technique is the Finite Element Method (FEM) which typically involves a division of a modeled objet into elements which physical behaviors can be computed and simulated through equations. Such CAE solutions are provided by Dassault Systemes under the trademark SIMULIA®. Another growing CAE technique involves the modeling and analysis of complex systems composed a plurality components from different fields of physics without CAD geometry data. CAE solutions allows the simulation and thus the optimization, the improvement and the validation of products to manufacture. Such CAE solutions are provided by Dassault Systemes under the trademark DYMOLA®.

PDM stands for Product Data Management. By PDM solution, it is meant any solution, software or hardware, adapted for managing all types of data related to a particular product. A PDM solution may be used by all actors involved in the lifecycle of a product: primarily engineers but also including project managers, finance people, sales people and buyers. A PDM solution is generally based on a product-oriented database. It allows the actors to share consistent data on their products and therefore prevents actors from using divergent data. Such PDM solutions are provided by Dassault Systemes under the trademark ENOVIA®.

Figure 2:
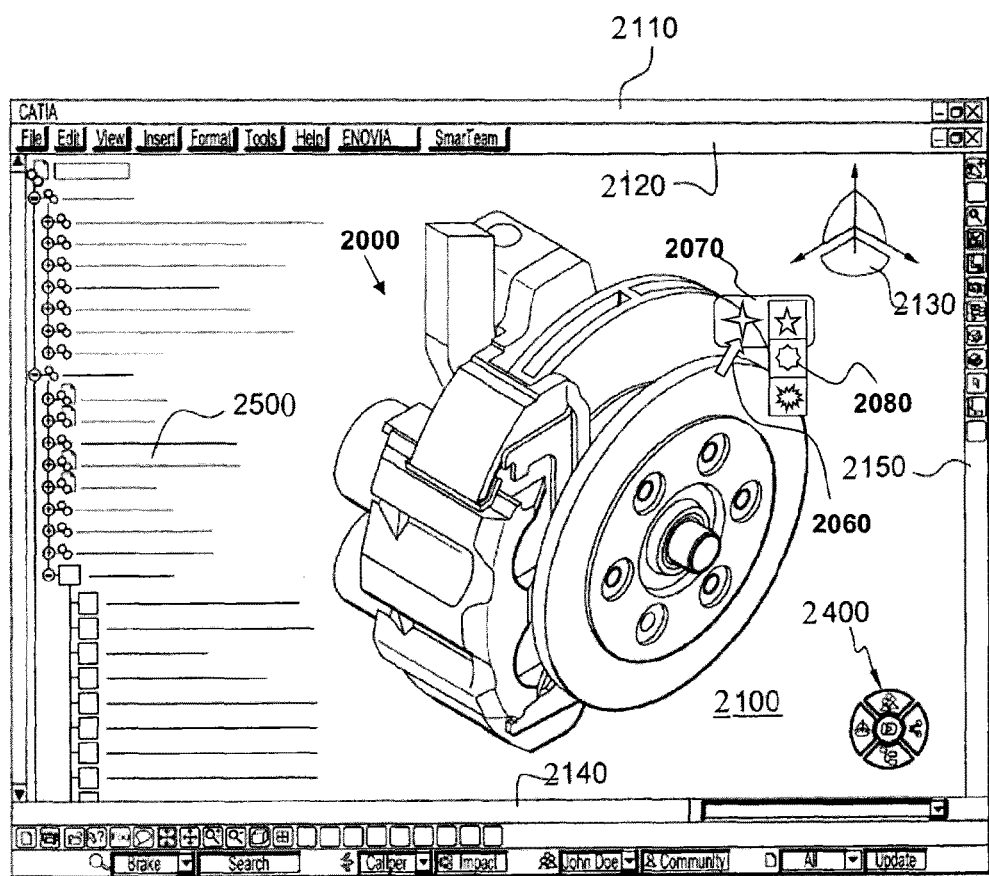
FIG. 2 shows an example of a graphical user interface of the system.

FIG. 2 shows an example of the GUI of the system, wherein the system is a CAD system.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100, displayed 3D modeled object 2000 being for example the result of performing the method. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen.

The GUI may for example display data 2500 related to the displayed product 2000. In the example of FIG. 2, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 3:
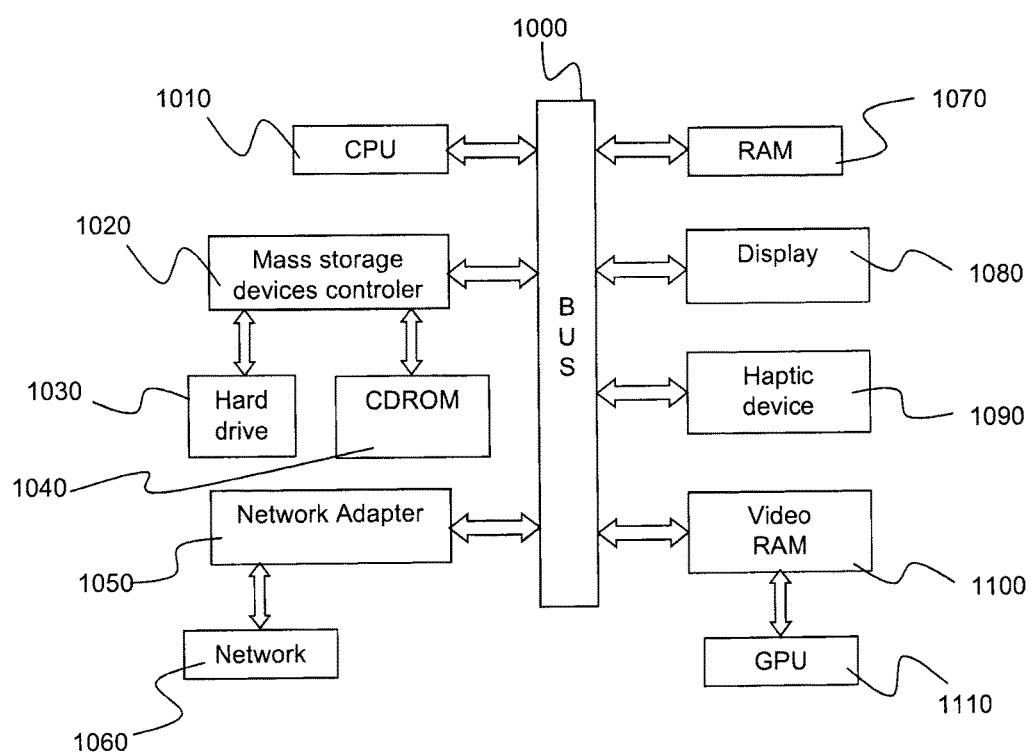
FIG. 3 shows an example of the system.

FIG. 3 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

"Designing a 3D modeled object" designates any action or series of actions which is at least part of a process of elaborating a 3D modeled object. Thus, the method may comprise creating the 3D modeled object from scratch. Alternatively, the method may comprise providing a 3D modeled object previously created, and then modifying the 3D modeled object. The design of a virtual product by using a computer aided geometric design is highly enhanced by using relationships connecting geometries. The CAD system captures the design intent in such a way that design changes can be propagated to related geometries through the said relationships so that the whole model can be automatically updated.

In the CAD world, there traditionally exist two kinds of relationships. To the opposite of the prior art, these two kinds coexist in the method.

The first kind is the so-called "procedural relationship", also named "historical relationship". It captures the fact that an object y is computed from an input object x through a procedure $f$. This is symbolically written $y=f(x)$ (where $f$ is a "mapping" from the mathematical point of view) and means that the output object y is uniquely defined by the input object x, and, consequently, the only way to change output object y is to change input object x into x', and to compute the new version y' of object y by using the procedure: $y'=f(x')$. A procedural relationship is definitively oriented from the input object toward the output object, and there is no way to change this orientation. A procedural relationship can be created a posteriori on existing objects. For example, computing an extruded solid from a planar profile can be implemented by a procedure. Changing the shape of the resulting solid is to edit the procedure and to change an input data: the shape of the profile or the depth value. Another example is a hole in a surface that defines the frame of a car, the hole for example representing a window. A chain of objects computed from one another through a procedural and acyclic data flow is a "history tree". Updating a history tree in the prior art is to run each procedure as soon as all its input objects are up to date. Since the network is acyclic, this process ends after a finite number of steps. All prior art history-based geometric modelers are based on this concept.

The second kind of relationships is called "live relationship" which means, in the context of the method, "non-historical relationships" or "non-procedural relationships". Live relationships include styling constraints relating curves and surfaces (e.g. tangency, matching, connecting surface, end point coincidence, connection smoothness). Live relationships also include dimensional constraints (e.g. distance, angle, circle radius, sphere radius, cylinder radius) and geometrical constraints (e.g. coincident, co-planar, tangent, coaxial, parallel). Live relationships can be created a posteriori on existing objects and they are not intrinsically oriented. For ease of use, they can be oriented, but this orientation can be reversed either by the CAD system or by the industrial designer. Thus, they are represented by bi-directional arcs in the method. A network of live relationships is solved by a specialized solver in the prior art. It takes into account all the relationships at the same time and it may run iterative numerical or combinatorial algorithms to compute the solution, for example by iteratively searching the solution of a system of equations. For example, 2D sketches are computed by dedicated solvers, 3D mechanical assemblies of rigid bodies are computed by dedicated solvers as well.

In the present method and CAD system, the industrial designer may thus design the 3D modeled object in the following way. The CAD system presents to the designer (in any graphical way), a list of geometrical objects and relationships between the geometrical objects. If designing from scratch, the industrial designer may create the first geometrical objects by declaring instances of predetermined primitive shapes selected from a library provided by the system (such as, obviously as a non-limiting example, segments, circles, ellipses, disks, spheres, rectangles, parallelepipeds, cylinders). The industrial designer may define values for parameters of such primitive shapes (such as lengths, positions). Later, the designer may construct new geometrical objects by using the existing ones, or by again instantiating primitive objects. The geometrical objects are in any case blocks of data stored separately (e.g. as a list) that define the geometry of the 3D modeled object, typically in an interrelated way as discussed below. The set of geometrical objects is typically presented to the designer who can thus distinguish them.

At any time, the industrial designer may define live relationships or even procedural relationships between one or more existing geometrical objects. From a computer-implementation point of view, these relationships do not modify the list of existing objects, but they impose constraints on the values of the parameters of the existing objects (if impacted by the live relationships). Live relationships are thus non-procedural relationships in the sense that they do not create new geometry, but they modify existing geometry. Live relationships are constraints linked to existing geometrical objects of the 3D modeled object. They are said to be "live", because the designer may create such a relationship live, by simple manipulations of the existing objects, and the industrial designer may immediately see the result (without new geometry needing to be added). Live relationships of the method may include styling relationships (e.g. the above-mentioned tangency, matching, connecting surface, end point coincidence, connection smoothness relationships) and/or mechanical relationships (e.g. the above-mentioned dimensional constraints—e.g. distance, angle, circle radius, sphere radius, cylinder radius—and/or the above-mentioned geometrical constraints—e.g. coincident, co-planar, tangent, coaxial, parallel). These types of live relationships prove particularly useful in the context where the industrial product is a mechanical part or a consumer good.

At any time, the designer may define procedural relationships involving one or more existing geometrical objects. The procedural relationships may typically be constructive, in the sense that they take one or more existing objects (of the above-mentioned list of existing objects presented to the user), and they add new objects to that list. Contrary to live relationships, procedural relationships do usually not modify the input geometry (i.e. a procedural relationship has no action on the values of the parameters of its input geometrical objects). These output objects are persistently related to the input objects from which they stem out, such that deleting the input objects necessarily deletes the output objects. The objects created by the procedural relationships may then be used themselves as inputs of subsequent procedural relationships, or they may be involved by live relationships. However, as noted earlier, a procedural relationship may also be added between existing objects, if the output(s) defined thereby indeed correspond to the input(s) defined thereby (such correspondence being optionally enforceable by the addition of the procedural relationship).

It is important to note that the differences between procedural relationships and live relationships have a great impact on the computer-implementation of the method and of the system, from a computer data point of view. Indeed, referring to object-oriented programming, these two kinds of relationships are programmed objects/classes that have totally different behaviors as they involve other objects (geometrical objects in the present case) in different ways. These behaviors have an impact on ergonomics which is particularly relevant in an industrial context. The fact that the method allows the two types of relationships and thus the two behaviors for the same 3D modeled object is advantageous, notably in the case of mechanical parts or consumer goods which can be very complex and each involve dozens or hundreds of features.

In the prior art, each kind of relationship can be evaluated or solved separately. Procedural relationships are evaluated by updating an acyclic dataflow; live relationships are solved by dedicated algorithms. Because of a better and better integration of CAD tools, there is a use for the industrial designer to create relationships of both kinds within the same model of geometries. The problem is that mixing these two technologies is difficult. The typical situation is an output object y of a procedure $y=f(x)$ that is connected through a first live relationship with another object z which in turn is connected through a second live relationship with the input object x of the procedure. Editing object x and evaluating procedure $f(\bullet)$ changes object y, which may change object z and then change object x which is the input object of procedure $f(\bullet)$. Clearly, this cyclic data flow deserves a solving technology which can be neither the live solver alone nor the procedural evaluation alone. The problem is that there exists no industrial algorithm providing generic and acceptable solutions. This conclusion comes from tests performed by the Applicant through a prototype. The computed results may behave in an unpredictable, unstable or non-natural way from the industrial designer point of view.

Clearly, there exists a technological gap between two unsatisfactory situations. On one hand, two separated technologies (in short: procedural vs. non-procedural) and on the other hand the full integration of these two technologies. The method constitutes an intermediate solution allowing a certain level of cohabitation of live and procedural relationships into a heterogeneous network. In an example presented later, the whole network is updated through a finite sequence, alternating procedural evaluations and live solving performed on appropriate subsets of the networks. This can be referred to by the expression "sequential update" in the following.

Examples of possible applications of the method are now discussed with reference to FIGS. 4-7.

Figure 4:
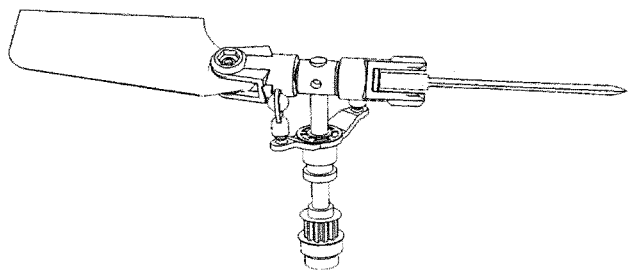
Figure 5:
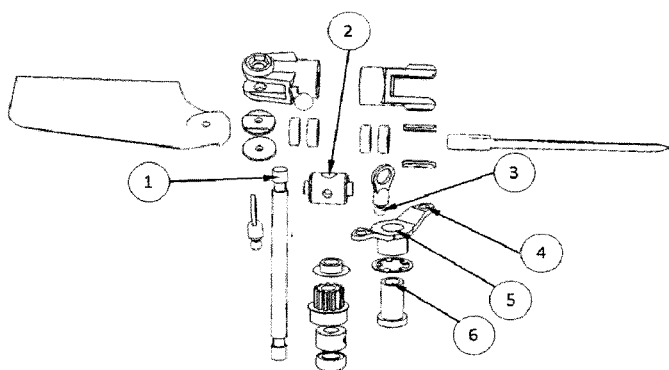

A typical use of dimensional and geometrical (mechanical) constraints is the design of mechanical assemblies. FIG. 4 illustrates a helicopter tail rotor, as displayed on the screen of the CAD system. This mechanical assembly includes a plurality of parts together with geometric relationships. Each mechanical part is a single solid and each geometrical relationship links a couple of functional surfaces of two solids. FIG. 5 illustrates a disassembled configuration of the assembly so that all parts are visible. In this assembly, cylindrical surface 1 is coaxial with cylindrical surface 2. Cylindrical surface 5 is coaxial with cylindrical surface 6. Spherical surface 3 is concentric with spherical surface 4. Many other such geometric relationships are created by the industrial designer. The solver of the method computes the positions of all solids so that the whole assembly fits all relationships.

Figure 6:
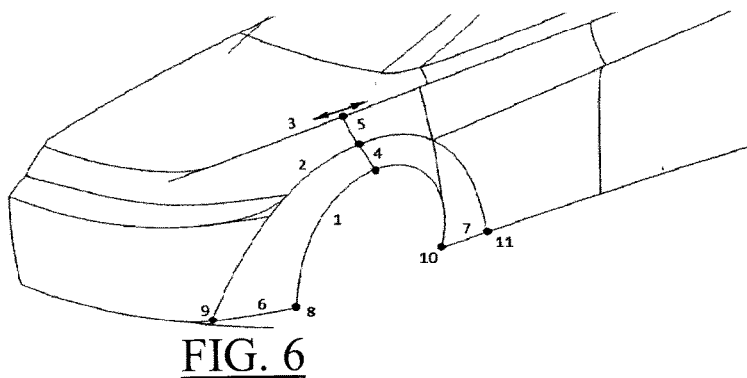
Figure 7:
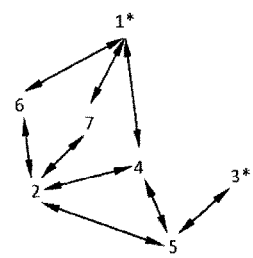

A typical use of styling constraints is car body design. FIG. 6 illustrates the shape of a car body being designed by using curves and surfaces. The industrial designer creates curves at first, then surfaces are created by selecting closed contours of curves. The industrial designer also creates matching and tangency relationships linking couples of curves or couple of surfaces. Curves 1 to 7 are connected through styling relationships according to the graph of FIG. 7. For clarity, it should be understood that end points of curve 1 are points 8 and 10 and that end points of curve 2 are points 9 and 11. Curves 1 and 3 are fixed curves. End points of curves 6 and 7 are shared with end points of curve 1. End points of curve 2 are respectively constrained on curve 6 and curve 7. End points of curve 4 are respectively constrained on curve 1 and curve 2. End points of curve 5 are respectively constrained on curve 2 and curve 3. Finally, end points of curve 5 lying on curve 2 is coincident with the end point of curve 4 lying on curve 2, and, at this point, the connection between curve 4 and curve 5 is curvature continuous. A styling solver is able to maintain all these relationships when the industrial designer changes the geometry, for example by sliding the end point of curve 5 along curve 3.

Classical features of solid modeling are listed in table I. In the context of the present discussion, "feature" stands for "procedural relationship" between input and output objects. The nature of input objects is detailed. The output object is always a solid. The procedural relationships of Table I may all or partly be contemplated by the method.

TABLE I

Classical features in solid modeling

| Name | Input | Output |
| --- | --- | --- |
| Extrusion | Planar profile, direction, range | Extruded solid |
| Revolute | Planar profile, axis, angular range | Revolute solid |
| Sweep | Planar profiles, guiding curves | Swept solid |
| Thick surface | Surface, thickness value | Thicken surface |
| Union, intersection, subtraction | Two solids | Solid |
| Split | Cutting surface, solid | Solid |
| Round, fillet | Sharp edge(s) of a solid, radius | Solid |
| Draft angle | Face(s) of a solid, pulling direction, draft angle | Solid |
| Shell | Opening face(s) of a solid, shell value | Shelled solid |
| Thickness | Face(s) of a solid, thickness value | Solid |
| Transform | Solid, transformation (translation, rotation, mirror, scaling, affinity) | Transformed solid |
| Pattern | Reference feature on a solid, grid definition | Solid with repeated feature |

Step S30 is now discussed.

As mentioned earlier, the modification of the data defining the 3D modeled object may be any modification of a parameter of an existing geometrical object and/or of an existing relationship. It may also designate the addition of a new geometrical object or a new relationship (as in S20) or the deletion of an existing geometrical object or of an existing relationship. Upon such a modification, the method determines a so-called "strong graph". The strong graph is unique and designates the graph of strong components of the modeling graph (with nodes that represent the geometrical objects and arcs that each represent the relationship linking the two geometrical objects represented by the incident nodes of the arc, wherein the procedural relationships are represented by unidirectional arcs having the same orientation as the procedural relationships, and wherein the live relationships are represented by bidirectional arcs). The strong components concept is detailed later and is known from graph theory. Many results from graph theory are used in the present discussion. A classical reference is: Frank Harary, *Graph Theory*, Addison Wesley 1969. Wikipedia offers a discussion of the strong component concept at the time the priority application is filed.

Upon any modification of the 3D modeled object, the method offers a live update of the object. This is particularly useful in case the 3D modeled object is represented/displayed to the industrial designer. In such a case, the designer may see directly the effects of the modification. The update may also take place at a later time, as mentioned earlier. In any case, the update is performed based on the strong graph, and more specifically according to a traversal of the strong graph. In other words, arcs of the strong graph are followed/browsed by the update S30 of the method. Yet in other words, the method performs the update according to the structure of the strong graph, and more particularly according to the orientation of the arcs of the strong graph. In a specific example detailed later, the traversal of the strong graph is the well-known depth first traversal. This allows a fast and robust update, with a good use of the criterion related to S20. Notably, during the traversal of the strong graph, each strong component may be solved independently of the remainder of the modeling graph. In other words, the method uses the structure of the geometrical objects and the relationships that link them, which structure is captured by the modeling graph, and the method reorganizes this structure into another structure, namely the strong graph. Then, the method solves groups of geometrical objects that correspond to a strong component independently, by adequately alternating such solving and the replay of procedures that link objects of different strong components between them. This allows a reuse of dedicated solvers for models where only live relationships are implemented. For example, each strong component may be solved by an equation system solver (i.e. a solver that translates a set of live relationships into a system of equations and substantially solves the system) or by an iterative solver (i.e. a solver that iteratively tests values of the parameters of the 3D modeled object to reach a state where the constraints involved by the set of live relationships are substantially respected). These solvers are known from the prior art. They include variational solvers and styling solvers. The nature of the solver depends on the application and on the nature of the live relationships involved in the strong components to be solved.

The method thus defines a restriction, the "sequential criterion", for mixing procedural relationships together with live relationships. The restriction guarantees in the example of the method including S30 that the sequential update can be performed. Furthermore, the method in the example including S20 provides a facility to edit the network of relationships in such a way that said sequential criterion is maintained.

Figure 8:
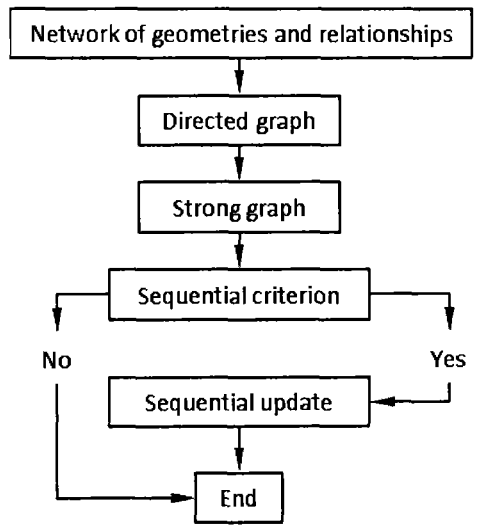
Figure 9:
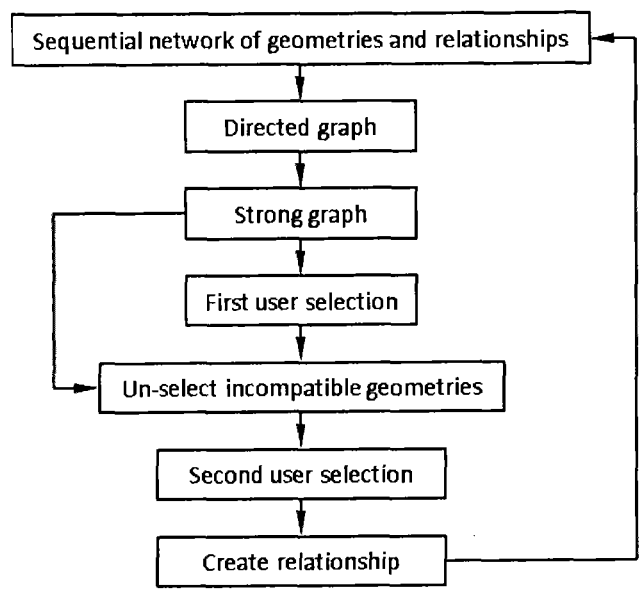

The diagram of FIG. 8 illustrates the process of the above-discussed example for sequential criterion diagnosis and sequential update. The directed (modeling) graph and the strong graph are mathematical concepts translated by the method into specific data used to perform the computations. The diagram of FIG. 9 illustrates the process for saving the sequential criterion during the creation of a live or procedural relationship in the network. Once again, the directed (modeling) graph and the strong graph are mathematical concepts translated by the method into specific data used to perform the computations.

The method provides a genuine level of integration of procedural and non-procedural relationships, in terms of data model and in terms of updating. In turn, the value for the industrial designer is a more flexible and powerful design system as well as extended design capabilities. The sequential criterion defined by the invention is a guide rather than a limitation. It helps the industrial designer take benefits of a heterogeneous network and avoids any manual management of complex cyclic situations. The sequential criterion may be maintained safely all through the design process, ensuring sequential updates at all time. This saves integrity and reliability of the CAD system. Another advantage of the invention is the possible reuse of existing procedural evaluation and live solvers. The new algorithm is an overhead that defines and executes the update sequence. This makes the implementation easy and robust.

Graph theory background is now provided to better understand the method.

First, the concept of directed graph used by the method (the modeling graph being a directed graph) is now discussed.

A directed graph is a four-tuple $G=(X, U, \alpha, \omega)$ where X is the set of nodes, U is the set of arcs and where $\alpha: U \rightarrow X$ and $\omega: U \rightarrow X$ are the connections functions. Expression $\alpha(u)=x$ means that $x \in X$ is the initial node of arc $u \in U$. Arc u is an output arc of node x. Expression $\omega(u)=y$ means that $y \in X$ is the end node of arc $u \in U$. Arc u is an input arc of node y.

According to these notations, set $\omega^{-1}(y)$ is the set of input arcs of node y, $\alpha^{-1}(x)$ is the set of output arcs of node x, set $\alpha(\omega^{-1}(y))$ is the set of input nodes of node y and set $\omega(\alpha^{-1}(x))$ is the set output nodes of node y.

By definition, a root node r has no input arc, meaning that $\omega^{-1}(r)=\emptyset$. A leaf node l has no output arc, meaning that $\alpha^{-1}(l)=\emptyset$.

Other graph theory concepts used by the method are now discussed.

Figure 10:
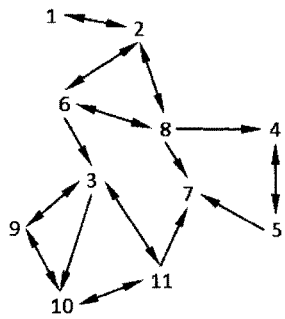

Cycle: A cycle is a list of arcs $u_1, \ldots, u_n$ such that $\omega(u_i)=\alpha(u_{i+1})$ for $i=1, \ldots, n-1$ and $\omega(u_n)=\alpha(u_1)$. A cycle can be defined as well by a list of nodes $x_1, \ldots, x_n$ such that for $i=1, \ldots, n-1$ exist an arc $u_i$ such that $\alpha(u_i)=x_i$ and $\omega(u_i)=x_{i+1}$ and an arc $u_n$ such that $\alpha(u_n)=x_n$ and $\omega(u_n)=x_1$. FIG. 10 illustrates a directed graph. The set of nodes is $X=\{1, 2, \ldots, 11\}$. An arrow with a double orientation is a graphical shortcut for two arrows featuring reverse orientations. Nodes 3,10,11 define a cycle.

Sub-graph: Given a subset of nodes $Y \subset X$, the corresponding sub-graph H of G is defined by all arcs of G connecting nodes Y. Formally, $H=(Y,V,\alpha,\omega)$ where $V=\{u \in U, \alpha(u) \in Y, \omega(u) \in Y\}$.

Directed Acyclic Graph:

By definition, a directed acyclic graph includes no cycle.

Strong Component:

The goal of strong components is to organize a directed graph into sub-graphs in such a way that sub-graphs include all the cycles and that they are connected together in an acyclic way. This graph theory concept is the most efficient to organize the cyclic and acyclic characteristics of a directed graph. This key feature of the method is detailed in the following.

Formally, the first step is to define the relationship $\rho$ on the set of nodes X. Two nodes $x, y \in X$ are associated, which is noted $x\rho y$, if there exist a path of arcs from x to y and a path of arcs from y to x. Clearly, $\rho$ is an equivalence relation (reflexive, symmetrical, transitive). So, thanks to basic algebra, relation $\rho$ separates set X into equivalence classes $X_1, \ldots, X_p$, defining a partition of X. This means that $X=U_{i=1}^{p}X_i$ and $X_i \cap X_j = \emptyset$ if $i \neq j$.

By definition, each $X_i$ is a strong component of graph G. Of course, there may exist arcs connecting nodes from one $X_i$ to nodes of another other $X_j$, but they do not belong to any cycle.

All cycles are captured in sub-graphs defined by $X_i$, respectively noted $G_i$.

The mapping class: $X \rightarrow \{X_1, \ldots, X_p\}$ is defined by $class(x)=X_i$ if $x \in X_i$. This mapping is well defined because each x belongs to exactly one $X_i$.

Figure 11:
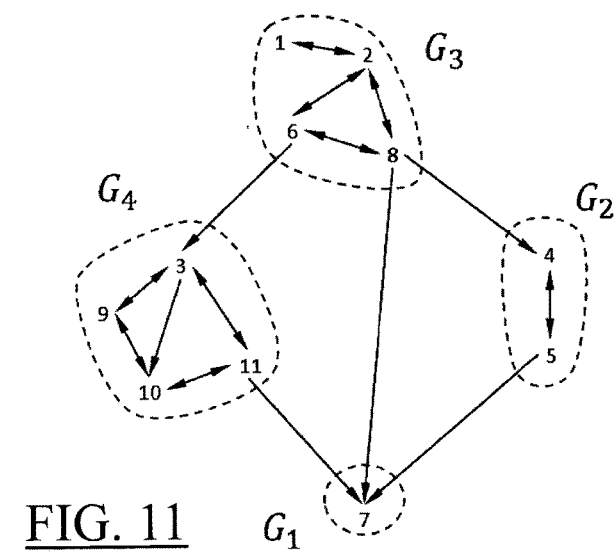

FIG. 11 illustrates the strong components (surrounded by dotted lines) of the previous graph. Formally, $X_1=\{7\}$, $X_2=\{4,5\}$, $X_3=\{1,2,6,8\}$ and $X_4=\{0,9,10,11\}$. Furthermore, $class(6)=X_3$, $class(4)=X_2$, etc.

Strong Components Computation:

Strong components can be computed by the following algorithm. The core algorithm computes the strong component including a given node. Before starting, all nodes are unmarked and the counter n of strong components is zero.

1. If exists a node x not marked, then n:=n+1, else, go to step 6.
2. Set mark ±n to node x.
3. Set mark +n to all nodes that can be reached from node x by using arcs of the graph in their original orientation.
4. Set mark −n to all nodes that can be reached from node x by using arcs of the graph in their reverse orientation.
5. Create a new strong component including the list of nodes marked ±n and go to step 1.
6. End.

Figure 12:
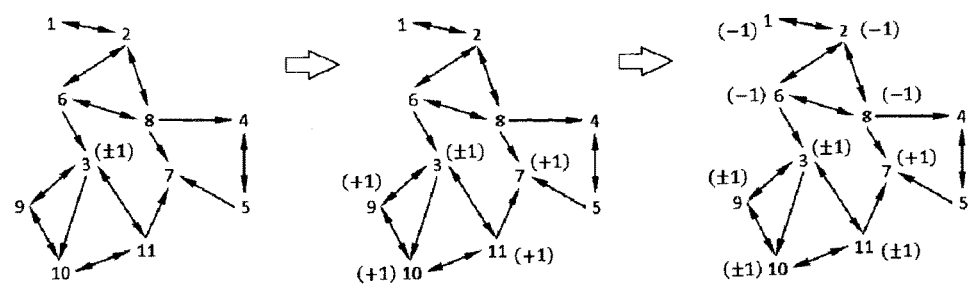

FIG. 12 illustrates the computation of the (first) strong component including node 3. Leftmost picture is the graph after step 2, center picture is the graph after step 3 and rightmost picture is the graph after step 4. The strong component of node 3 is $\{3,9,10,11\}$.

Strong Graph:

By definition, the nodes of the strong graph S are the strong components $X_i$ and the arcs of the strong graph S are those of graph G connecting two nodes from distinct subsets $X_i$ (severals such arcs possibly existing for the same pair of subsets $X_i$, and thus several arcs possibly connecting the same pair of nodes of the strong graph). Formally, $S=(X_S, U_S, \alpha_S, \omega_S)$ with:

$$X_S = \{X_1, \ldots, X_p\}$$

$$U_S = \{u \in U, class(\alpha(u)) \neq class(\omega(u))\}$$

$$\alpha_S(u) = class(\alpha(u))$$

$$\omega_S(u) = class(\omega(u))$$

By construction, the strong graph is always acyclic.

Figure 13:
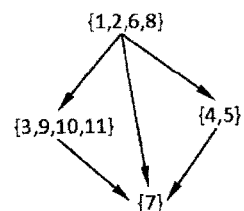

FIG. 13 illustrates the strong graph of the example.

Parent/child nodes and tribes in a directed acyclic graph:

Let $K=(Z, W, \alpha, \omega)$ be a directed acyclic graph, and let $z \in Z$ be particular node, named the "selected node". By definition, a node $z' \in Z$ is a "child node" (resp. "parent node") of z if there exists a chain of arcs from z to z' (resp. a chain of arcs from z' to z). By definition, a "tribe node" is a parent node or a child node.

Parent nodes and child nodes can be easily computed by visiting arcs of the graph.

FIG. 14 illustrates an example of directed acyclic graph and the selected node is "a". Child nodes of "a" are "b", "c" and "d". Parent nodes of "a" are "e" and "g". Consequently, tribe nodes of "a" are "b", "c", "d", "e", and "g".

Modeling the network of relationships with a directed graph (i.e. the modeling graph) is now discussed.

The network of geometries and relationships is modeled by a graph. Nodes of the graph represent geometrical objects and arcs represent relationships.

A procedural relationship $z=f(x, y)$ is represented by arcs u and v connecting input objects x and y to output object z.

Arcs are oriented from the input objects x, y of procedure $f$ toward the output object z of procedure $f$. In other words, $\alpha(u)=x$, $\omega(u)=z$, $\alpha(v)=y$, $\omega(v)=z$. A single procedure can be modeled by several arcs, depending on the number of input objects. The output object of the procedure is always unique. Arcs modeling procedural relationships are called "procedural arcs". This is illustrated by FIG. 15.

From the CAD industrial designer point of view, a live relationship can be oriented or non-oriented. When oriented, it can be reversed or set non-oriented. When non-oriented, it can be oriented in any way. For these reasons, live relationships are modeled as follows.

A live relationship connecting two geometries a and b is represented by two arcs v, w. One is oriented from a to b and the other is oriented from b to a (equivalent to a bidirectional arc). In other words, $\alpha(v)=\omega(w)=x$ and $\alpha(w)=\omega(v)=y$. Arcs modeling a live relationship are called "live arcs".

This modeling captures the fact that a procedural relationship is always oriented and can never be reversed as opposed to a live relationship. From the graphical point of view, an arrow with a single orientation is a procedural arc and a double oriented arrow is a live arc. By nature, all live arcs are included in strong components.

The sequential update criterion that may be applied in an example of the method is now discussed.

Given a network of procedural and live relationships, and given its associated graph, the criterion for sequential update is the following: no procedural arc can be included in a strong component. If the sequential criterion is fulfilled, all procedural arcs belong to the strong graph, and, by construction, they are connected in an acyclic way.

The example graph in FIG. 16 does not fit this criterion because of the procedural arc 3→10 in strong component $G_4$. It can be corrected, for example, by removing this arc (as illustrated in FIG. 17) or by replacement with a live arc 3⇆10 (not illustrated).

An example of the sequential update algorithm that may applied at S30 by the method is now discussed.

The alternate sequence of live solving and procedural evaluations is obtained by traversing the strong graph $S=(X_S, U_S, \alpha_S, \omega_S)$. Remember that each node of the strong graph defines a sub-graph of the initial graph representing geometries and live relationships.

If the strong graph features more than one leaf node, a unique (and symbolic) leaf node is added by creating oriented arcs from each leaf node to the added leaf node. This way one can always suppose that the strong graph has a unique leaf node.

The traversal algorithm uses a last-in-first-out list (LIFO list in the following) so as to notably implement the depth first traversal. Adding element x at the end of the list is written Put(x). Reading the last element of the list is written Read(y). Instruction Read(•) does not change the number of elements in the list. Removing the last element from the list is written RemoveLast.

The sequential update algorithm is described in the diagram of FIG. 18. It is mainly a depth-first traversal starting at the leaf node and using the reverse orientation of arcs. A "Build" method, detailed in the following, is invoked during the traversal. The initialization is to put the unique leaf node of the strong graph in the list. Before starting, all nodes are marked 0, which is noted p(x):=0 for all $x \in X_S$. Roughly speaking, p(x)=0 stands for "the sub-graph defined by x is not yet solved" and p(x)=1 stands for "the sub-graph defined by x is solved".

In the example, when solving a strong component, each geometrical object represented by a node of the strong component that is the output of a procedural relationship (including procedural relationships whose input node is one of a previously solved strong component) is set fixed. This allows a robust solving and a relatively high respect of user-intent. Collisions may be handled in any way.

Method "Build" is invoked on a node y of the strong graph S. This node is in fact a strong component and is a subset of nodes of the original graph G, meaning that $y=X_i$. Set $\omega_S^{-1}(y)$ is the set of all input arcs of node y. By nature, they are procedural arcs. Set $\omega(\omega_S^{-1}(y))$ is the set of nodes of the original graph that are end nodes of procedural arcs $\omega_S^{-1}(y)$. Method "Build" performs the following two actions.

Build (y)
Evaluate all procedures modeled by procedural arcs $\omega_S^{-1}(y)$. The set $\omega(\omega_S^{-1}(y))$ includes output objects of this evaluation.

Solve the live sub-graph defined by $y=X_i$ considering that objects of $\omega(\omega_S^{-1}(y))$ are fixed and cannot be modified.

The sequential update algorithm is designed in such a way that procedural methods are always evaluated after all their input objects are evaluated or solved.

Figure 19:
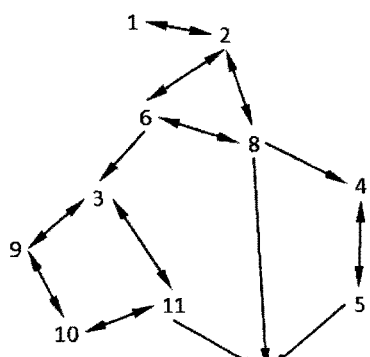
Figure 20:
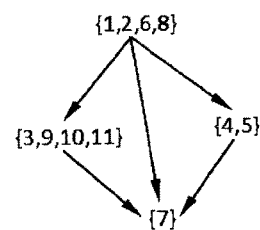

The algorithm is run with the example graph. For readability, both the initial graph G (FIG. 19) and the strong graph S (FIG. 20) are illustrated. The LIFO list is noted L The (unique) leaf node {7} is put in the list so that L=({7}). Since input node {4,5} of last element {7} of L is marked 0, it is added to the list, so that L=({7}, {4,5}). Since input node {1,2,6,8} of last element {4,5} of L is marked 0, it is added to the list, so that L=({7}, {4,5}, {1,2,6,8}).

Last element {1,2,6,8} of L has no input nodes. So, the "Build" method is applied to {1,2,6,8}, meaning that the live sub-graph of G defined by nodes 1,2,6,8 is solved. Then node {1,2,6,8} of graph S is marked 1 and removed from L, so that L=({7}, {4,5}).

Now, all input nodes of last element {4,5} of L are marked 1, so the "Build" method is applied to {4,5} meaning that:
  the procedure modeled by arc 8→4 that computes output object 4 from input object 8 is evaluated;
  the live sub-graph of G defined by nodes 4,5 is solved considering that object 4 is fixed.

Node {4,5} of graph S may indeed be marked 1 and removed from L, so that L=({7}). Input node {3,9,10,11} of last element {7} in L is marked 0, so it is added to L thus L=({7}, {3,9,10,11}).

Since all input nodes of last element {3,9,10,11} of L are marked 1, the "Build" method is applied to {3,9,10,11} meaning that:
  the procedure modeled by arc 6→3 that computes output object 3 from input object 6 is evaluated;
  the live sub-graph of G defined by nodes 3,9,10,11 is solved considering that object 3 is fixed.

Then, node {3,9,10,11} of graph S is marked 1 and removed from L, so that L=({7}).

Finally, all input nodes of last element {7} of L are marked 1, so the "Build" method is applied to {7} meaning that the procedure modeled by arcs 11→7, 8→7 and 5→7 that computes output object 7 from input objects 5,8,11 is evaluated. Then, node {7} of graph S is marked 1 and removed from L, so that L=0.

As expected, the sequential update algorithm executes an alternate sequence of procedural evaluations and live solves (star nodes are fixed when solved):
  1. Solve: {1,2,6,8}.
  2. Evaluate: 8→4.
  3. Solve: {4*, 5}.
  4. Evaluate: 6→3.

5. Solve: {3*,9,10,11}.
6. Evaluate: 5,8,11→7.

An example of the method where the sequential criterion is saved through network edition thanks to S20 is now discussed.

Figure 21:
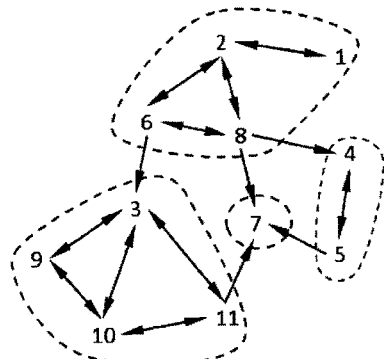
Figure 22:
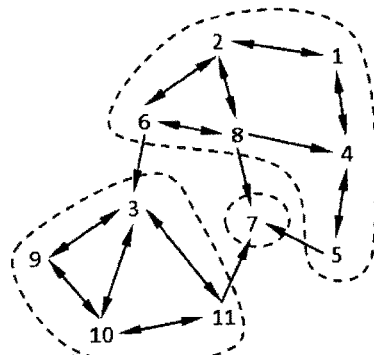
Figure 23:
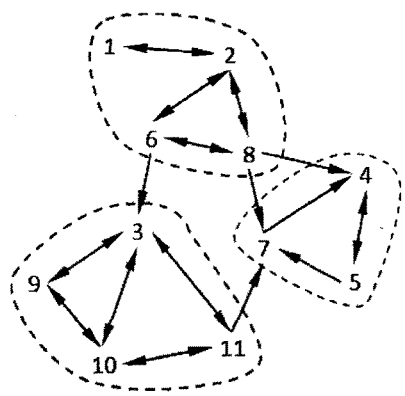

The question is now to maintain the sequential criterion when the industrial designer edits the network of relationships. Deleting a live relationship or deleting a procedural relationship cannot create a new cycle in the graph, so the sequential criterion is saved. Creating a new procedural object is to add a new node (modeling the output object) and arcs oriented from some previous nodes (modeling the input objects) to the new node. This operation cannot create a new cycle, so the sequential criterion is saved. Consequently, the only operations that may invalidate the sequential criterion are adding a live relationship or adding a procedural relationship between existing objects, a posteriori. For example, adding a live relationship between nodes 4 and 1 in the graph of FIG. 21 leads to strong component {1,2,4,5,6,8} that includes procedural arc 8→4, as illustrated in the graph of FIG. 22. Clearly, the sequential criterion is lost. In another example, adding a procedural relationship from node 7 to node 4 in the graph of FIG. 21 leads to strong component {4,5,7} that includes procedural arcs 5→7 and 7→4, as illustrated in FIG. 23. Clearly, the sequential criterion is lost.

As explained, in this example, it is intended that the provided modeling graph respects a criterion that all the arcs of each strong component of the modeling graph are bidirectional. In other words, geometrical objects of a same strong component are not related to each other by a procedural relationship, such that procedural relationships potentially involving them are necessarily with geometrical objects of other strong components. In order to preserve this criterion, the method comprises at S20, upon adding a live or procedural relationship between existing objects, a specific selection of two geometrical objects to be linked by the live or procedural relationship to be added. The selection S20 is performed according to the criterion. In other words, the system may direct the industrial designer to adding live or procedural relationships to specific pairs of existing geometrical objects (at least for those live or procedural relationships that take two objects as input). This direction may be rigid (i.e. the user cannot break the criterion) or just a guidance (the user is simply helped in the selection and indicated—in any way—if the selection of a given pair of objects is compliant or not with the criterion).

In an example, the selection of the two geometrical objects to be linked by the live relationship to be added comprises selecting a first geometrical object among all geometrical objects. This is typically performed manually by the user (i.e. via user-interaction). Then the selection comprises identifying (e.g. automatically by the system) within the modeling graph all geometrical objects for which adding the live relationship between them and the first geometrical object would break the criterion. An efficient and robust way to implement such an identification, which consists in determining all tribe nodes of all nodes included in the strong component of the first geometrical object, is explained later. And then the method comprises selecting (typically by the designer—via user-interaction) a second geometrical object according to the identified geometrical objects. As can be seen, steps other than selections can be fully automatic. If the selection is rigid as mentioned above, the selection of the second object may be restricted to geometrical objects of the modeling graph not identified to break the criterion.

The interactive dialogue to create a live relationship may thus ask the industrial designer to select a first element and a second element. As soon as the first element is selected, the system in an example is able to anticipate the selection of an appropriate second element by identifying all elements of the network that would invalidate the sequential criterion if selected. From the graphic user interface point of view, it is enough to make these elements un-selectable and under intensified. Then, the selection suggested to the industrial designer always saves the sequential criterion.

Now, determining all tribe nodes of all nodes included in the strong component of the first geometrical object may be performed in a fast and robust way by determining the strong graph of the modeling graph, and then determining within the strong graph all tribe nodes of the strong component of the first geometrical object.

Given a selected node x in graph G (representing the user selected element of the network), incompatible nodes may be identified as follows.

1. Get the node Class(x) of the strong graph S including the selected node x.
2. In the strong graph S, compute the tribe nodes of Class(x) noted Tribe(Class(x)).
3. Nodes of graph G that are incompatible with selected node x, noted Ic(x), are the union of all tribe nodes:

$$Ic(x) = \bigcup_{Y \in Tribe(Class(x))} Y$$

Figure 24:
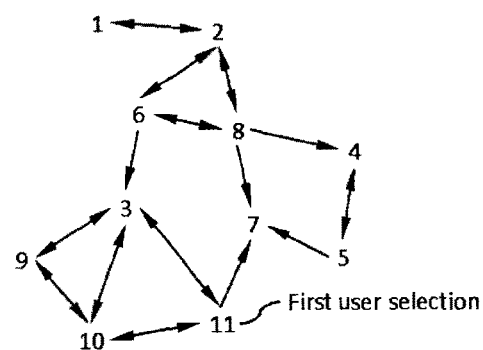
Figure 25:
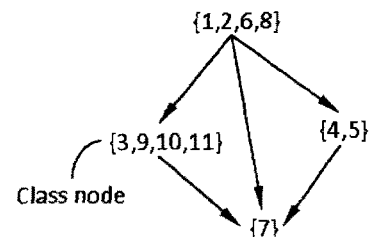

FIGS. 24-28 exemplify the identification of incompatible nodes. The selected node of the initial graph G is x=11, as illustrated in FIG. 24. The strong graph node including the selection is Class(11)={3,9,10,11}, as illustrated in FIG. 25.

Figure 26:
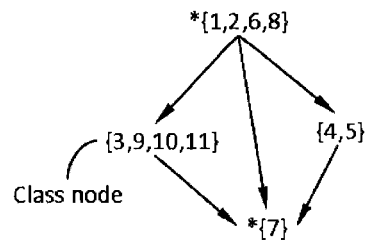

In the strong graph, incompatible nodes of {3,9,10,11} are {1,2,6,8} and {7}, as illustrated in FIG. 26. According to the formalism, this means that:

Tribe(Class(11))=Tribe({3,9,10,11})={{1,2,6,8},{7}}

Then, incompatible nodes are:

Ic(11)={1,2,6,8}∪{7}={1,2,6,7,8}

Figure 27:
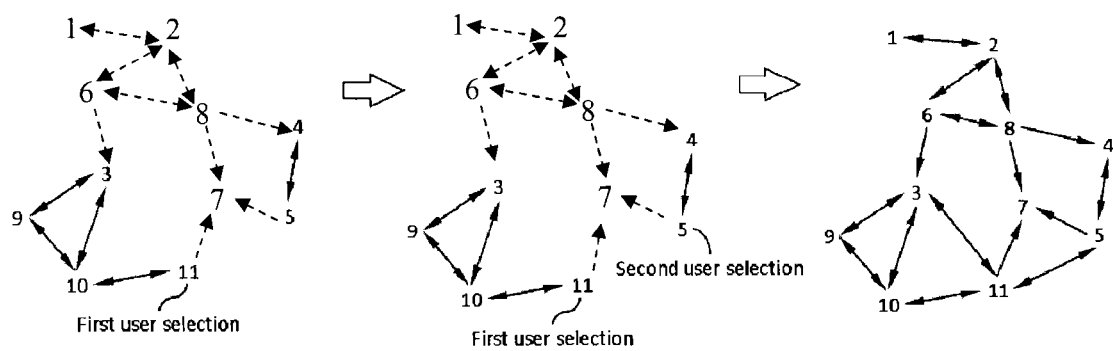

Un-selectable arcs and nodes on the initial graph are illustrated in leftmost drawing in FIG. 27. If the second user selection is node 5, as illustrated in center drawing in FIG. 27, a live relationship connecting nodes 11 and 5 is created and the resulting graph is the rightmost drawing in FIG. 27.

Figure 28:
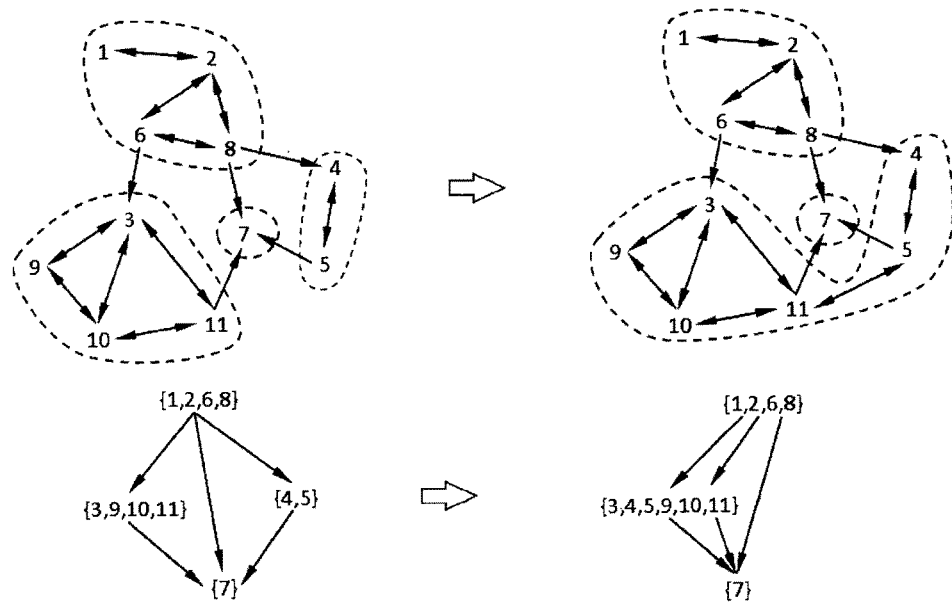
Figure 29:
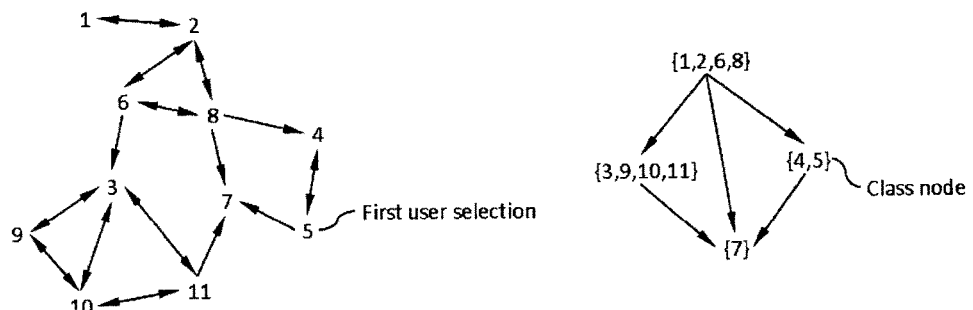

It must be noticed that creating arc 11↔5 changes the strong components even though the sequential criterion is saved, as illustrated in FIG. 28.

The interactive dialogue to create a procedural relationship asks the user to select a first element and a second element. As soon as the first element is selected, the method may anticipate the selection of an appropriate second element by identifying all elements of the network that would invalidate the sequential criterion if selected. From the graphic user interface point of view, it is enough to make these elements un-selectable and under intensified. Then, the selection suggested to the user always saves the sequential criterion. Let x be the selected node in graph G (representing the user selected element of the network). Suppose that the selected element is the starting node of the oriented arc being created. Then, incompatible nodes are identified as follows, 1. Get the node Class(x) of the strong graph S including the selected node x.
2. In the strong graph S, compute the parent nodes of Class(x) noted Parent(Class(x)).

3. Nodes of graph G that are incompatible with selected node x, noted Ic(x), are the nodes of Class(x) together with the union of all parent nodes:

$$Ic(x) = \text{Class}(x) \cup \left( \bigcup_{Y \in Parent(Class(x))} Y \right)$$

If the selected element is the ending node of the oriented arc being created, the same method is used by replacing the Parent method with the Child method.

FIGS. 29-32 exemplify the identification of incompatible nodes. The selected node of the initial graph G is x=5, as illustrated in leftmost drawing in FIG. 29, and the user's intention is to create an oriented arc starting at node 5. The strong graph node including the selection is Class(5)={4,5}, as illustrated in rightmost drawing in FIG. 29. In the strong graph, incompatible nodes of {4,5} are {4,5} itself and {1,2,6,8} because Parent(Class(5))=Parent({4,5})={{1,2,6,8}} and, according to the formula:

$$Ic(5) = \text{Class}(5) \cup \left( \bigcup_{Y \in Parent(Class(5))} Y \right)$$

$$= \{4, 5\} \cup \left( \bigcup_{Y \in \{\{1,2,6,8\}\}} Y \right)$$

$$= \{4, 5\} \cup \{1, 2, 6, 8\}$$

$$= \{1, 2, 4, 5, 6, 8\}.$$

Figure 30:
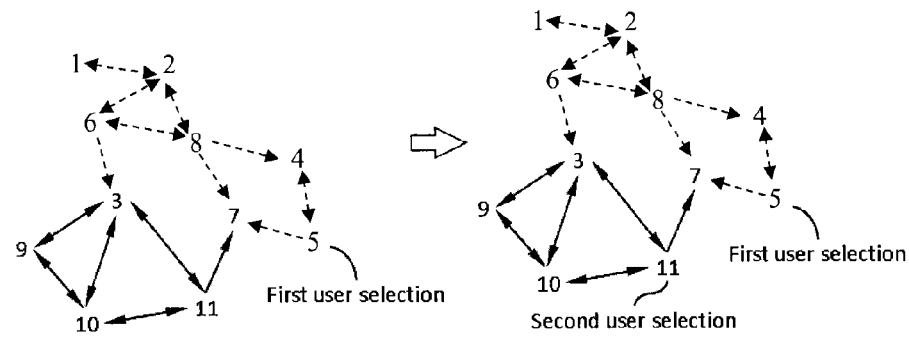
Figure 31:
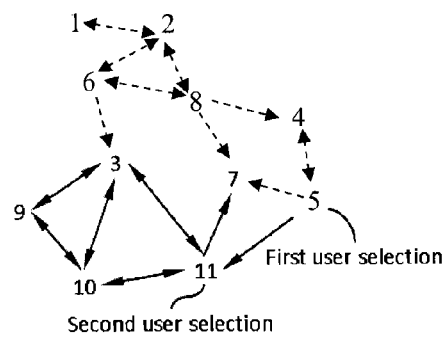
Figure 32:
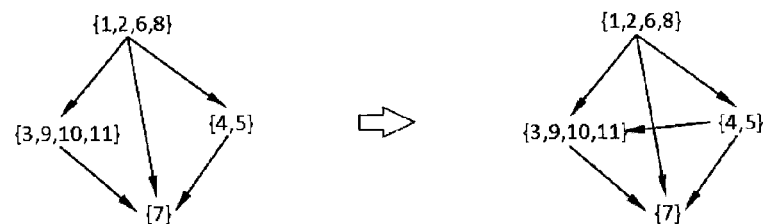

Un-selectable arcs and nodes on the initial graph are illustrated in leftmost drawing in FIG. 30. If the second user selection is node 11, as illustrated in rightmost drawing in FIG. 30, a procedural relationship connecting node 5 to node 11 is created, as illustrated in FIG. 31. It must be noticed that creating arc 5→11 does not change the strong components, as illustrated in FIG. 32.

The following scenario may typically be executed by the system.
1. First creation step
   a. Create a plane $P_1$.
   b. Create a plane $P_2$.
   c. Create a distance constraint $d_1$ between $P_1$ and $P_2$. This makes $P_1$ and $P_2$ parallel.
   d. Sketch a profile $K_1$ on $P_2$.
   e. Extrude a solid pad $S_1$ from $K_1$ with extensions $h_1$ and $h_2$.
   f. Create a plane $P_3$.
   g. Create a distance constraint $d_2$ between $P_3$ and a side face of $S_1$. The system moves plane $P_3$ only.
2. First modification step.
   a. Fix $P_1$.
   b. Change distance value $d_1$ into $\tilde{d}_1$ and ask for update.
   c. $P_2$, $K_1$, $S_1$ are $\tilde{d}_1$-$d_1$ translated by the system.
   d. $P_3$ is not moved by the system.
3. Second modification step.
   a. Unfix
   b. Change distance value $d_2$ into $\tilde{d}_2$ and ask for update.
   c. $P_3$ should be $\tilde{d}_2$-$d_2$ translated. All other geometries are not moved by the system.
4. Second creation step.
   a. Create plane $P_4$.
   b. Go to the distance constraint creation dialog.
   c. Select a face of S.
   d. $P_1$, $P_2$, and $P_3$ is not offered to be selectable by the system. $P_4$ is offered to be selectable by the system.

The invention claimed is:

1. A computer-implemented method for designing, on a CAD system comprising a graphical user interface, a 3D modeled object that represents a geometry of an industrial product to be manufactured in the real world, and that is defined by data including a plurality of geometrical objects and relationships linking the geometrical objects, wherein:
the relationships linking the geometrical objects include procedural and live relationships,
each said procedural relationship represents a mapping which defines an output from an input by taking as input at least one given geometrical object and creating as output a new geometrical object, the new geometrical object being defined by the at least one given geometrical object, the new geometrical object being changeable only by changing the at least one geometrical object, and the at least one given geometrical object as the input corresponding to blocks of data that define a geometry of the at least one geometrical object, and
each said live relationship represents a constraint between two given geometrical objects that modifies said two given geometrical objects but does not create any new geometrical object, and
wherein the computer-implemented method comprises:
upon user interaction with the graphical user interface:
   declaring geometrical objects,
   defining at least one live relationship between two declared geometrical objects, and
   defining at least one procedural relationship taking as input at least one declared geometrical objects and creating as output a new geometrical object, wherein said new geometrical object is usable to define another relationship;
the user interaction resulting in a modeling graph having nodes that represent the geometrical objects and arcs that each represent the defined relationship linking the two geometrical objects represented by the incident nodes of the arc, wherein the procedural relationships are represented each by at least one respective unidirectional arc having an orientation from a starting node to an ending node, the geometric object represented by the starting node of the respective unidirectional arc being at least part of the input of the procedural relationship, the geometric object represented by the ending node of the respective unidirectional arc being at least part of the output of the procedural relationship, and the orientation of the unidirectional arcs representing procedural relationships being unmodifiable, wherein the live relationships are represented by bidirectional arcs, and wherein the provided modeling graph respects a criterion that all the arcs of each strong component of the modeling graph are bidirectional;
upon user interaction with the graphical user interface, adding a relationship linking two of the geometrical objects that are included in the data defining the 3D modeled object before the addition; and
upon the adding of the relationship, selecting a first geometrical object and a second geometrical object to be linked by the relationship to be added, the selecting being performed according to the criterion,
wherein the selecting of the first geometrical object and the second geometrical object includes:
   selecting, upon user interaction with the graphical user interface, the first geometrical object among the declared geometrical objects, identifying within the modeling graph, automatically by the CAD system, all geometrical objects for which adding the relationship between them and the first geometrical object would break the criterion that all the arcs of each strong component of the modeling graph are bidirectional, and selecting, upon user interaction with the graphical user interface, the second geometrical object according to the identified geometrical objects.

2. The method of claim 1, wherein the relationship to be added is a live relationship, and the identifying consists of determining all tribe nodes of all nodes included in the strong component of the first geometrical object, or the relationship to be added is a procedural relationship taking the first geometrical object as input and the identifying consists of determining all parent nodes of all nodes included in the strong component of the first geometrical object, or the relationship to be added is a procedural relationship having the first geometrical object as output and the identifying consists of determining all child nodes of all nodes included in the strong component of the first geometrical object.

3. The method of claim 2,
wherein the determining all tribe nodes or all parent nodes or all child nodes of all nodes included in the strong component of the first geometrical object is performed by determining the strong graph of the modeling graph, wherein the strong graph is the graph of strong components of the modeling graph, and then determining within the strong graph all tribe nodes or all parent nodes or all child nodes of the strong component of the first geometrical object.

4. The method of claim 1, wherein the selection of the second geometrical object is restricted to geometrical objects of the modeling graph not identified to break the criterion.

5. The method of claim 1, wherein the live relationship is a styling relationship and/or a mechanical relationship.

6. The method of claim 5, wherein the industrial product is a mechanical part or a consumer good.

7. The method of claim 1, comprising, upon a further modification of the data defining the 3D modeled object, determining a strong graph, wherein the strong graph is the graph of strong components of the modeling graph, and updating the 3D modeled object according to a traversal of the strong graph.

8. A method of generating a representation of a three-dimensional object that represents a geometry of an industrial product to be manufactured in the real world, the three-dimensional object being designed by a computer-implemented method for designing, on a CAD system comprising a graphical user interface, a 3D modeled object that represents the geometry of the industrial product to be manufactured in the real world, and that is defined by data including a plurality of geometrical objects and relationships linking the geometrical objects, wherein:

the relationships linking the geometrical objects include procedural and live relationships, each said procedural relationship represents a mapping which defines an output from an input by taking as input at least one given geometrical object and creating as output a new geometrical object, the new geometrical object being defined by the at least one given geometrical object, the new geometrical object being changeable only by changing the at least one geometrical object, and the at least one given geometrical object as the input corresponding to blocks of data that define a geometry of the at least one geometrical object, and each said live relationship represents a constraint between two given geometrical objects that modifies said two given geometrical objects but does not create any new geometrical object, and wherein the method for designing the 3D modeled object comprises:

upon user interaction with the graphical user interface:
declaring geometrical objects,
defining at least one live relationship between two declared geometrical objects, and
defining at least one procedural relationship taking as input at least one declared geometrical objects and creating as output a new geometrical object, wherein said new geometrical object can be used to define another relationship;

the user interaction resulting in a modeling graph having nodes that represent the geometrical objects and arcs that each represent the defined relationship linking the two geometrical objects represented by the incident nodes of the arc, wherein the procedural relationships are represented each by at least one respective unidirectional arc having an orientation from a starting node to an ending node, the geometric object represented by the starting node of the respective unidirectional arc being at least part of the input of the procedural relationship, the geometric object represented by the ending node of the respective unidirectional arc being at least part of the output of the procedural relationship, and the orientation of the unidirectional arcs representing procedural relationships being unmodifiable, wherein the live relationships are represented by bidirectional arcs, and wherein the provided modeling graph respects a criterion that all the arcs of each strong component of the modeling graph are bidirectional;

upon user interaction with the graphical user interface, adding a relationship linking two of the geometrical objects that are included in the data defining the 3D modeled object before the addition; and upon the adding of the relationship, selecting a first geometrical object and a second geometrical object to be linked by the relationship to be added, the selecting being performed according to the criterion, wherein the selecting of the first geometrical object and the second geometrical object includes:
selecting, upon user interaction with the graphical user interface, the first geometrical object among the declared geometrical objects,
identifying within the modeling graph, automatically by the CAD system, all geometrical objects for which adding the relationship between them and the first geometrical object would break the criterion that all the arcs of each strong component of the modeling graph are bidirectional, and selecting, upon user interaction with the graphical user interface, the second geometrical object according to the identified geometrical objects.

9. A method for manufacturing an industrial product, comprising:
designing a three-dimensional object that represents a geometry of the industrial product according to a computer-implemented method for designing, on a CAD system comprising a graphical user interface, a 3D modeled object that represents the geometry of the industrial product, and that is defined by data including a plurality of geometrical objects and relationships linking the geometrical objects, wherein:
the relationships linking the geometrical objects include procedural and live relationships,
each said procedural relationship represents a mapping which defines an output from an input by taking as input at least one given geometrical object and creating as output a new geometrical object, the new geometrical object being defined by the at least one given geometrical object, the new geometrical object being changeable only by changing the at least one geometrical object, and the at least one given geometrical object as the input corresponding to blocks of data that define a geometry of the at least one geometrical object, and
each said live relationship represents a constraint between two given geometrical objects that modifies said two given geometrical objects but does not create any new geometrical object, and
wherein the method comprises:
upon user interaction with the graphical user interface:
declaring geometrical objects,
defining at least one live relationship between two declared geometrical objects, and
defining at least one procedural relationship taking as input at least one declared geometrical objects and creating as output a new geometrical object, wherein said new geometrical object can be used to define another relationship;
the user interaction resulting in a modeling graph having nodes that represent the geometrical objects and arcs that each represent the defined relationship linking the two geometrical objects represented by the incident nodes of the arc, wherein the procedural relationships are represented each by at least one respective unidirectional arc having an orientation from a starting node to an ending node, the geometric object represented by the starting node of the respective unidirectional arc being at least part of the input of the procedural relationship, the geometric object represented by the ending node of the respective unidirectional arc being at least part of the output of the procedural relationship, and the orientation of the unidirectional arcs representing procedural relationships being unmodifiable, wherein the live relationships are represented by bidirectional arcs, and wherein the provided modeling graph respects a criterion that all the arcs of each strong component of the modeling graph are bidirectional;
upon user interaction with the graphical user interface, adding a relationship linking two of the geometrical objects that are included in the data defining the 3D modeled object before the addition;
upon the adding of the relationship, selecting a first geometrical object and a second geometrical object to be linked by the relationship to be added, the selecting being performed according to the criterion; and
manufacturing the industrial product based on the designed three-dimensional object,
wherein the selecting of the first geometrical object and the second geometrical object includes:
selecting, upon user interaction with the graphical user interface, the first geometrical object among the declared geometrical objects,
identifying within the modeling graph, automatically by the CAD system, all geometrical objects for which adding the relationship between them and the first geometrical object would break the criterion that all the arcs of each strong component of the modeling graph are bidirectional, and
selecting, upon user interaction with the graphical user interface, the second geometrical object according to the identified geometrical objects.

10. A non-transitory data storage medium having recorded thereon a computer program comprising instructions for performing a computer-implemented method for designing, on a CAD system comprising a graphical user interface, a 3D modeled object that represents a geometry of an industrial product to be manufactured in the real world, and that is defined by data including a plurality of geometrical objects and relationships linking the geometrical objects, wherein:
the relationships linking the geometrical objects include procedural and live relationships,
each said procedural relationship represents a mapping which defines an output from an input by taking as input at least one given geometrical object and creating as output a new geometrical object, the new geometrical object being defined by the at least one given geometrical object, the new geometrical object being changeable only by changing the at least one geometrical object, and the at least one given geometrical object as the input corresponding to blocks of data that define a geometry of the at least one geometrical object, and
each said live relationship represents a constraint between two given geometrical objects that modifies said two given geometrical objects but does not create any new geometrical object, and
wherein the method comprises:
upon user interaction with the graphical user interface:
declaring geometrical objects,
defining at least one live relationship between two declared geometrical objects, and
defining at least one procedural relationship taking as input at least one declared geometrical objects and creating as output a new geometrical object, wherein said new geometrical object can be used to define another relationship;
the user interaction resulting in a modeling graph having nodes that represent the geometrical objects and arcs that each represent the defined relationship linking the two geometrical objects represented by the incident nodes of the arc, wherein the procedural relationships are represented each by at least one respective unidirectional arc having an orientation from a starting node to an ending node, the geometric object represented by the starting node of the respective unidirectional arc being at least part of the input of the procedural relationship, the geometric object represented by the ending node of the respective unidirectional arc being at least part of the output of the procedural relationship, and the orientation of the unidirectional arcs representing procedural relationships being unmodifiable, wherein the live relationships are represented by bidirectional arcs, and wherein the provided modeling graph respects a criterion that all the arcs of each strong component of the modeling graph are bidirectional;
upon user interaction with the graphical user interface, adding a relationship linking two of the geometrical objects that are included in the data defining the 3D modeled object before the addition; and
upon the adding of the relationship, selecting a first geometrical object and a second geometrical object to be linked by the relationship to be added, the selecting being performed according to the criterion, wherein the selecting of the first geometrical object and the second geometrical object includes:
selecting, upon user interaction with the graphical user interface, the first geometrical object among the declared geometrical objects,
identifying within the modeling graph, automatically by the CAD system, all geometrical objects for which adding the relationship between them and the first geometrical object would break the criterion that all the arcs of each strong component of the modeling graph are bidirectional, and
selecting, upon user interaction with the graphical user interface, the second geometrical object according to the identified geometrical objects.

11. A CAD system comprising a processor coupled to a memory and a graphical user interface, the memory having recorded thereon a computer program comprising instructions for performing a computer-implemented method for designing, on the CAD system comprising the graphical user interface, a 3D modeled object that represents a geometry of an industrial product to be manufactured in the real world, and that is defined by data including a plurality of geometrical objects and relationships linking the geometrical objects, wherein:
the relationships linking the geometrical objects include procedural and live relationships,
each said procedural relationship represents a mapping which defines an output from an input by taking as input at least one given geometrical object and creating as output a new geometrical object, the new geometrical object being defined by the at least one given geometrical object, the new geometrical object being changeable only by changing the at least one geometrical object, and the at least one given geometrical object as the input corresponding to blocks of data that define a geometry of the at least one geometrical object, and
each said live relationship represents a constraint between two given geometrical objects that modifies said two given geometrical objects but does not create any new geometrical object, and
wherein the method comprises:
upon user interaction with the graphical user interface:
declaring geometrical objects,
defining at least one live relationship between two declared geometrical objects, and
defining at least one procedural relationship taking as input at least one declared geometrical objects and creating as output a new geometrical object, wherein said new geometrical object can be used to define another relationship;
the user interaction results in a modeling graph having nodes that represent the geometrical objects and arcs that each represent the defined relationship linking the two geometrical objects represented by the incident nodes of the arc, wherein the procedural relationships are represented each by at least one respective unidirectional arc having an orientation from a starting node to an ending node, the geometric object represented by the starting node of the respective unidirectional arc being at least part of the input of the procedural relationship, the geometric object represented by the ending node of the respective unidirectional arc being at least part of the output of the procedural relationship, and the orientation of the unidirectional arcs representing procedural relationships being unmodifiable, wherein the live relationships are represented by bidirectional arcs, and wherein the provided modeling graph respects a criterion that all the arcs of each strong component of the modeling graph are bidirectional;
upon user interaction with the graphical user interface, adding a relationship linking two of the geometrical objects that are included in the data defining the 3D modeled object before the addition; and
upon the adding of the relationship, selecting a first geometrical object and a second geometrical object to be linked by the relationship to be added, the selecting being performed according to the criterion,
wherein the selecting of the first geometrical object and the second geometrical object includes:
selecting, upon user interaction with the graphical user interface, the first geometrical object among the declared geometrical objects,
identifying within the modeling graph, automatically by the CAD system, all geometrical objects for which adding the relationship between them and the first geometrical object would break the criterion that all the arcs of each strong component of the modeling graph are bidirectional, and
selecting, upon user interaction with the graphical user interface, the second geometrical object according to the identified geometrical objects.

* * * * *